United States Patent
Naoe et al.

(10) Patent No.: US 6,678,479 B1
(45) Date of Patent: Jan. 13, 2004

(54) SEMICONDUCTOR ELECTRO-ABSORPTION OPTICAL MODULATOR INTEGRATED LIGHT EMISSION ELEMENT LIGHT EMISSION ELEMENT MODULE AND OPTICAL TRANSMISSION SYSTEM

(75) Inventors: Kazuhiko Naoe, Yokohama (JP); Kazuhisa Uomi, Hachioji (JP); Masahiro Aoki, Kokubunji (JP); Minoru Fujita, Yokohama (JP)

(73) Assignee: Opnext Japan, Inc. (JP)

(*) Notice: Subject to any disclaimer, the term of this patent is extended or adjusted under 35 U.S.C. 154(b) by 0 days.

(21) Appl. No.: 09/516,912

(22) Filed: Mar. 1, 2000

(51) Int. Cl.$^7$ ............................................. H04B 10/06
(52) U.S. Cl. ........................................ 398/183; 359/237
(58) Field of Search ................................. 359/180–188, 359/248, 276

(56) References Cited

U.S. PATENT DOCUMENTS

| | | | |
|---|---|---|---|
| 5,394,260 A | * 2/1995 | Suzuki et al. | 359/158 |
| 5,657,148 A | 8/1997 | Feuer et al. | 359/263 |
| 5,798,856 A | * 8/1998 | Suzuki et al. | 359/181 |
| 5,891,748 A | 4/1999 | Sakata | 438/31 |
| 5,987,046 A | * 11/1999 | Kobayashi et al. | 372/45 |

FOREIGN PATENT DOCUMENTS

EP          741316 A1     11/1996

OTHER PUBLICATIONS

"Simple Measurement of Fiber Dispersion and Chirp Parameter of Intensity Modulated Light Emitter." F. Devaux, et al. *Journal of Lightwave Technology.*, vol. 11 No. 12 pp. 1937–1940, Dec. 1993.

"A Multi–Section Electroabsorption Modulator Integrated DFB Laser for Optical Pulse Generation and Modulation" K. Sato, et al. *Tech Digest of ECOC.*, 1993 WeC7.2.

European Search report dated Jul. 31, 2000.

"Integrated Laser/ Modulators for High Capacity WDM Transmission Systems" by Tsang et al.–AT&T Bell Laboratories, Murray Hill, NJ.

"Monolithic Integration of Multiple_quantun–Well Lasers and Modulators for High–Speed Transmission" by Ramdane et al.

* cited by examiner

*Primary Examiner*—Leslie Pascal
*Assistant Examiner*—Sherif R Fahmy
(74) *Attorney, Agent, or Firm*—Sofer & Haroun, LLP

(57) ABSTRACT

For achieving a transmission light source having different transmission properties or characteristics, i.e., the a parameters, depending upon application thereof, in a light emission element of semiconductor EA modulator integrated type being constructed with a light emission portion for lasing with a single vertical mode and a plurality of EA modulators, wherein an absorption edge wavelength under the condition of applying no bias thereto, in the semiconductor multiple-quantum-well structure owned by the modulator which is near to an emission side of the light emission portion, is to be equal or longer than the absorption edge wavelength owned by the modulator positioned far from the emission side of the light emission portion.

16 Claims, 9 Drawing Sheets

SEMICONDUCTOR ELECTRO-ABSORPTION OPTICAL MODULATOR INTEGRATED LIGHT EMISSION ELEMENT LIGHT EMISSION ELEMENT MODULE AND OPTICAL TRANSMISSION SYSTEM

BACKGROUND OF THE INVENTION

The present invention relates to an electro-absorption (EA) modulator integrated light source (i.e., a light emission element) having a plurality of transmission properties or characteristics being different to each other, and further relates to a light emission element module for use in an optical transmission and an optical transmitter, and also an optical transmission system using therein.

Relevant prior arts will be mentioned in relation with first to third ones, below.

Relating to the first relevant art as the light emission element, by referring to attached FIGS. 1 to 4, the structure of a semiconductor Ea modulator integrated DFB (Distributed Feedback type) laser is explained, wherein a laser is used in a light emission portion.

The FIG. 1 shows the semiconductor EA modulator integrated DFB laser having wavelength of 1.5 μm, for use in an optical transmission of in transmission speed of 10 Gbit/s and 20 km in distance thereof. In this figure is shown a cross-section view of a portion of the stripes of the light emission element, for explaining the structure of the light emission element. This light emission element is formed, after forming a mask of oxidization film for a selective growth method on a n-type InP semiconductor substrate 100, with growing a lower optical separete-confinement-heterostructure 101 of n-type InGaAsP with the known selective growth method as a first growth of crystal, a strained multiple-quantum-well structure 102 composed of an undoped InGaAsP well layer and eight (8) cycles of barrier layers of undoped InGaAsP having a composition wavelength 1.15 μm, and an upper optical separete-confinement-heterostructure 103 of two (2) layers of an undoped InGaAsP layer and a p-type InGaAsP layer. With using such the method of the selective growth, in the total thickness thereof, the strained multiple-quantum-well structure in an EA modulator portion 108 is formed to be thinner than that in the laser portion 109. Accordingly, an absorption wavelength of the strained multiple-quantum-well structure in the EA modulator portion comes to be smaller than that of the laser portion 109. Further, the semiconductor EA modulator integrated DFB laser shown in the FIG. 1 is manufactured, by forming a diffraction grating, a p-type InP clad layer 104, a mesa layer and a re-growth of a Fe-InP layer 105 for concealing both sides of that mesa layer, and then electrodes 107. The modulator length, i.e., the length for injecting current into a wave-guide portion of the EA modulator, is selected to be 157 μm, by taking a capacity of the modulator portion and an extinction ratio thereof into the consideration for determining a band of the light emission element, and on a front end surface at the side of EA modulator is treated an antireflection coating 110, while on a terminal end surface a reflection coating.

Further, the FIG. 2 shows a light emission element module being installed with the above-mentioned light emission element thereon. The reference numeral 201 shown in the FIG. 2 indicates a chip carrier, on which the above-mentioned light emission element is mounted, and on which are formed strip lines for high frequency with a patterning technology or method, thereby building up a chip capacitor(s) and a terminal resistor(s), etc., within the light emission element module. Further, within the present light emission element module are installed or integrated a thermistor 202, an isolator 203, a lens 205, a high frequency signal relay substrate 206, a monitor PD install stem 209, and a cooling stem 208. A reference numeral 207 indicates a high frequency signal cable for electric signals.

With this optical element module, the transmission is possible on an ordinary fiber of 20 km (dispersal value: 400 ps/nm). However, the transmission is impossible on the fibers other than the ordinary one, being longer than 20 km, such as the fiber of 40 km (dispersal value: 800 ps/nm).

The reason of this lies in that the distance of optical transmission is restricted by chirping. Ordinarily in the transmission on the optical fiber, two factors, i.e., the chirping and an intensity of optical output can be mainly considered, of restricting the transmission distance. The restriction due to the intensity of optical output in the latter brings about no problem, since it can be amplified to a certain degree. The main problem here is the restriction due to the chirping in the former. The chirping means an expanse in the wavelength spectrum of light emitted from a semiconductor laser modulated. The reason or mechanism that the chirping restricts the transmission distance is as follows.

The chirping is caused by the following two (2) phenomena. First, during ON/OFF modulating in the light emission element, the chirping occurs in the wavelength due to changes in the refractive index and the absorption coefficient inside the light emission element. Second, it is a phenomenon that the chirping occurs since dispersion is generated when the light emitting from the light emission element propagates within the fiber. Accordingly, the larger the distance in the transmission distance of the fiber, the much more the chirping be caused by the latter. Further, when occurring the chirping too much, the wave-form of light signal is distorted to increase a pass penalty, thereby restricting the transmission distance.

A ratio, between the changes in refractive index and the absorption coefficient during the ON/OFF modulation of the light emission element, is an α parameter, and that is one of the causes of bringing about the chirping, and the lower the α, the less the amount of the chirping during the modulation, then it can be said that the fiber is endurable against the dispersion. Therefore, the smaller the α parameter, the less the ill influence, thereby enabling to extend the transmission distance without receiving the ill influence from the dispersion.

Also, with the a parameter, there are several methods for evaluation thereof, such as, one in which a large signal is inputted into the light emission element to measure it, or other in which a small signal is inputted to measure it by a fiber-response-peak method, etc. However, in the present specification, the α parameter is defined by an evaluation value in accordance with the fiber-response-peak method, wherein the small signal is inputted to the light emission element and a dispersion compensated filer is used (F. Devaux et al., "Simple Measurement of Fiber Dispersion and Chirp parameter of Intensity Modulated Light Emitter" J. Lightwave Technol., vol. 11, pp. 1937–1940, December 1993). Since the α parameter is defined as a ration a change amount in refractive index to that in absorption coefficient, i.e., (change amount in refractive index)/(change amount in absorption coefficient), it varies following voltage applied to the modulator portion of the light emission element, depends upon material and MQW (multiple-Quantum-Well) structure thereof, however the light emission element comes to have almost it's own value if it is manufactured under a certain condition of a specification, though there may be brought about a fluctuation therein a little.

The dependency (hereinafter, "α curve(s)") upon voltage applied to the EA modulator having a typical α parameter of the light emission element manufactured with those relevant arts, is shown in FIG. 3 by a curve (a). In the FIG. 3, the a parameter depicted by a curve (a) indicates a value from 0.1 to 1.0, i.e., at applying voltage around $(V_{mod}-V_{mod})/2$ when the voltage applied to the EA modulator is set at the modulation amplitude $V_{mod}$ of the EA modulator and the amplitude when it is set at high level $V_{OH}$. In case of this value of the α, according to the evaluation of the optical fiber with the light emission element module of those related arts, it is possible to satisfy a standard, which is desired in a pass penalty when transmitting the light signal through it at a distance of 20 km (dispersal value: 400 ps/nm), for example. However, when conducting the light transmission at the distance being greater than that of the ordinary fiber, i.e., 20 km, for example, at the distance 40 km (dispersal value: 800 ps/nm), the pass penalty exceeds the standard value thereof, therefore it is difficult to apply it into a practical use thereof. Accordingly, the EA modulator integrated DFB laser shown in the relevant arts is only applicable to a system having an optical transmission system, in which the dispersion in frequency of the light due to the optical fiber is compensated for every 20 km long, namely, it can be said to be the EA modulator integrated DFB laser for a version of 20 km.

An example of the configuration of an optical transmission system wherein the light emission element module is applied is shown in FIG. 4. After an optical transmitter apparatus 401 according to the relevant arts, it is constructed with providing an optical pre-amplifier 402, the optical fibers 403 of 20 km (dispersal value: 400 ps/nm), dispersion compensation fibers 404 being provided at ever distance of about 20 km, an optical post-amplifier 405, and an optical light receiver 406.

Next, explanation will be given on the structure of the second relevant art, by referring to the FIGS. 1, 3 and 4.

This explanation is one for an example, into which is applied the semiconductor EA modulator integrated DFB laser having a wavelength band of 1.5 μm, for use in optical transmission at transmission speed 10 Gbit/s and 40 km.

An aspect, differing from the first relevant art mentioned above, in particular, in the manufacturing processes or steps thereof, lies in an active layer portion of the semiconductor which is formed by the crystal growth method at first time. Explaining this by using the FIG. 1, the lower n-type InGaAsP optical separete-confinement-heterostructure 101 is laminated at thickness of 58 nm, and then the undoped strained multiple-quantum-well structure 102 and the undoped upper optical separete-confinement-heterostructure 103 at the thickness of 60 nm, with such the selective growth method. In this instance, the multiple-quantum-well structure is manufactured so that a set of wavelengths of the barrier layers InGaAsP in the strained multiple-quantum-well structure 102 is set at 1.3 μm and also the number of the well-layers is seven (7). Further, the sizes of the light emission element are so designed that the injection length in the EA modulator is at 177 μm, although it is at 157 μm in the first relevant art, but others than those are in the condition same to that of the first relevant art. Furthermore, a static property or characteristic and a high frequency property of characteristic, after being installed into the light emission element module, are almost same to those of the light emission element module, in which the light emission element of the first relevant prior art is installed. However, the α parameter indicates a value lower that the α in the light emission element module of the first relevant art, as shown in the FIG. 3(b), and the mark or polarity of the α is changed over into a negative one when applying voltage around $(V_{OH}-V_{mod})/2$ to the EA modulator. According to the transmission evaluation of optical fiber with the light emission element module, in which is applied the light emission element shown in this relevant prior art, differing from that of the first relevant art, it is possible to satisfy the standard of the desired pass penalty value when transmitting the light signal through the ordinary fibers of 40 km (dispersal value: 800 ps/nm). This is because the chirping is decreased down in the amount thereof due to the low α, when conducting ON/OFF modulating on the light emission element, as a result of this the chirping amount lies within an acceptable region thereof, even if the transmission distance in the optical fiber(s) is lengthened or elongated.

Explanation will be given on the structure or configuration of the optical transmission system with using an optical transmission apparatus, in which is installed the present light emission element module, by referring to the FIG. 4. Assuming that the optical transmission apparatus according to this relevant art is indicated by a reference numeral 401, it is constructed by comprising an optical pre-amplifier 402, optical fibers 403 having a length of 40 km (dispersal value: 800 ps/nm), an optical post-amplifier 405, and an optical receiver 406. Namely, at the distance of 40 km, the dispersion compensated fiber 404, being necessary in the case of the first relevant art, is not necessary here. On a while, in a case where an optical transmitter according to this relevant art is applied into the optical transmission system shown in the FIG. 4, into which the dispersion compensated fibers are inserted, the chirping is compensated too much because of the insertion of the dispersion compensated fibers therein. Because of this, an excessive dispersion occurs, and the pass penalty goes over the standard, therefore it is also impossible to be applied into practical use. Accordingly, the EA modulator integrated DFB laser shown in this relevant art is only applicable to a system having an optical transmission system, in which no compensation is made on the frequency dispersion of the light up to 40 km, i.e., it can be said to be the EA modulator integrated DFB laser for a version of 40 km.

Accordingly, as shown in those first and second relevant arts, the EA modulator integrated DFB lasers, each having different α parameters thereof, are manufactured, and the different systems are construct therewith. Namely, the EA modulator integrated DFB laser is used differently, depending upon the dispersal values of the optical fibers.

Further, the technology of the third relevant art will be explained as below.

The structure of the device, in which two (2) modulators are constructed in series in the DFB laser, is already known by, for example, in K. Sato et al., Tech. Digest of ECOC., (1993), WeC7, 2. "A Multi-section Electroabsorption Modulator Integrated DFB Laser for Optical Pulse Generation and Modulation". In case of this construction, the two (2) modulators, i.e., a modulator 1 and a modulator 2, being formed in series to the DFB laser, are totally same to each other in the structures of modulator, including, in such as the crystal structure and the modulator length thereof, and they also have the same α parameter therewith. Accordingly, when performing the optical transmission with this light emission element, the α parameter has almost equal value in both cases when the modulator 1 is driven and when the modulator 2 is driven, therefore the transmission property or characteristic comes to be the same one. Further, according to the mode in using the light emission element which is described in this relevant art, the modulator 1 of the two of them is applied for generating a RF pulse while the modulator 2 as an encoder. This is the light emission element for the purpose of using in a so-called time-sharing multiple optical transmission, as one of the optical transmission methods.

Therefore, according to the relevant arts mentioned above, the EA modulator integrated DFB laser must be designed depending upon each different system, in different optical transmission pass or passage.

In this manner, the fact that two or more kinds of the light emission elements and the light emission element modules must be manufactured for each system (for example, for use in transmission of 20 km, and for use in transmission of 40 km) brings about an important demerit from a view point of cost reduction that will be required in coming future. Also, from a view point on the side of using the light emission element or the light emission element module, the fact that the light emission element or the light emission element module has no compatibility between the systems causes a disadvantage in the use thereof, and it prevents from cost reduction and simplifying or shortening of the processes therefor.

For example, in a case when designing an optical transmission system from a site A in a certain city to a site B in another city, the dispersion compensated fiber(s) is/are introduced or inserted at an appropriate position(s), by taking the dispersion in the optical fiber of the distance between the side A and the side B and the a parameter thereof into the consideration, thereby to design the dispersion in the total transmission pass. However, if assuming that after that an destination in communication from the site A is changed to a site C in a new city located between the cities A and B, since the transmission distance is changed, therefore the dispersal value of the optical fiber must be changed. In this instance, since the value α of the light source of the optical transmitter is fixed according to the above relevant arts, there occurs a necessity that the dispersion compensated fiber(s) is/are build up at the optical receiver side of the site C of the new city, so as to adjust the dispersal value in the optical fibers of the optical transmission system, as a whole.

Those problems are caused by the facts that each EA modulator integrated FDB laser has only a certain one α parameter inherent and that it is no-changeable nor invariable.

SUMMARY OF THE INVENTION

An object, according to the present invention, is to provide a semiconductor electro-absorption optical modulator integrated light emission element, a light emission element module and an optical transmission system, wherein plural kinds of optical transmission systems can be structured by one light emission element, thereby obtaining simplification or shortening in the design time and in the manufacture processes thereof, as well as reduction of the cost thereof.

According to the present invention, for dissolving the above-mentioned problems, each the modulator integrated light emission element has a plurality of the a parameter characteristics.

Therefore, in a case where the light emission element is constructed with a first modulator and a second modulator, each having the respective characteristic, the first modulator 1 is used when transmitting the light from a cite A to a cite B, and then the second modulator 2 is used when the destination in communication from the cite A is changed to a cite C located between the cites A and B. In this manner, with the provision of only one of the light emission element or the light emission element module, it is possible to cope with two (2) systems.

BRIEF DESCRIPTION OF THE DRAWING(S)

Figure 12A:
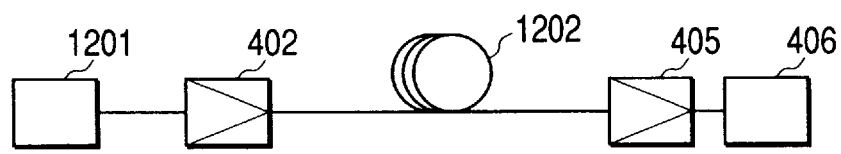
Figure 12B:
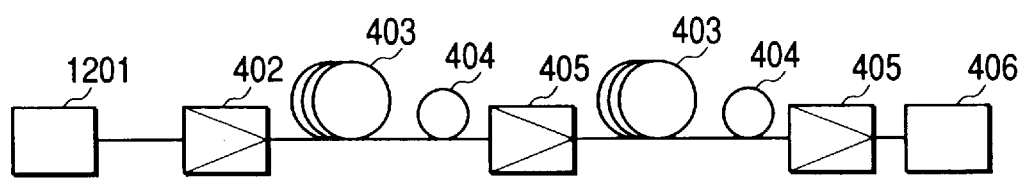
Figure 13:
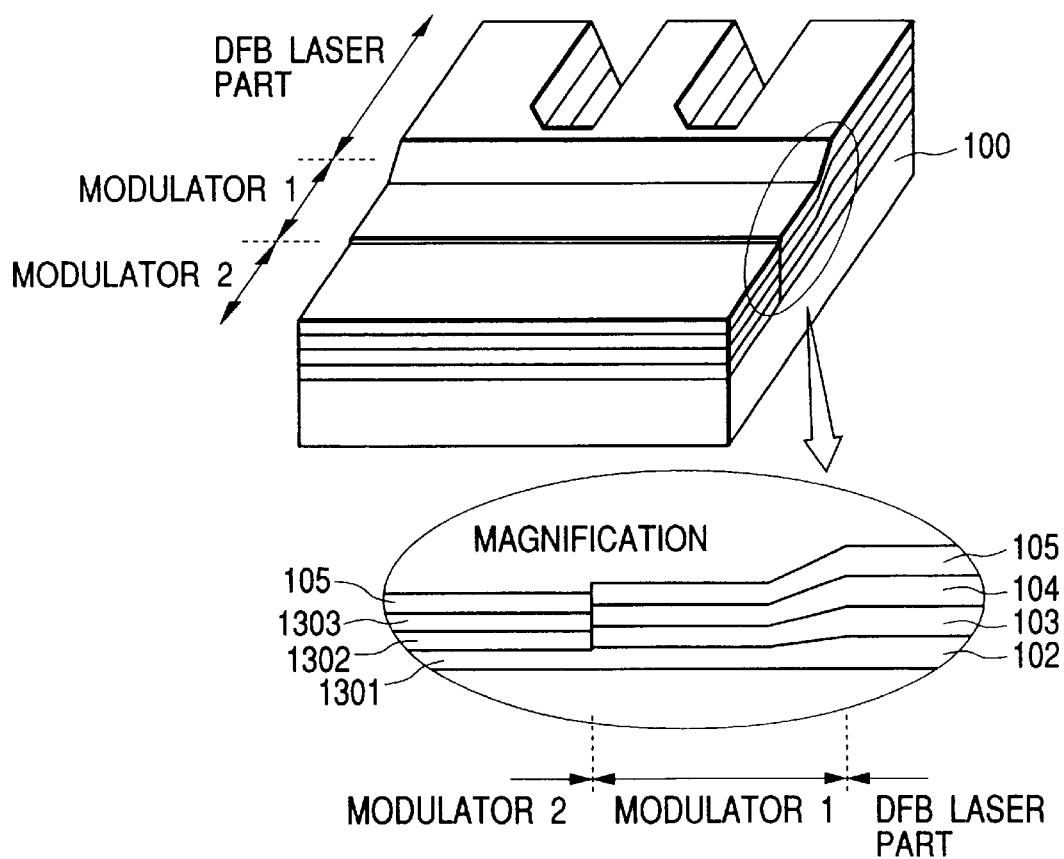
Figure 14:
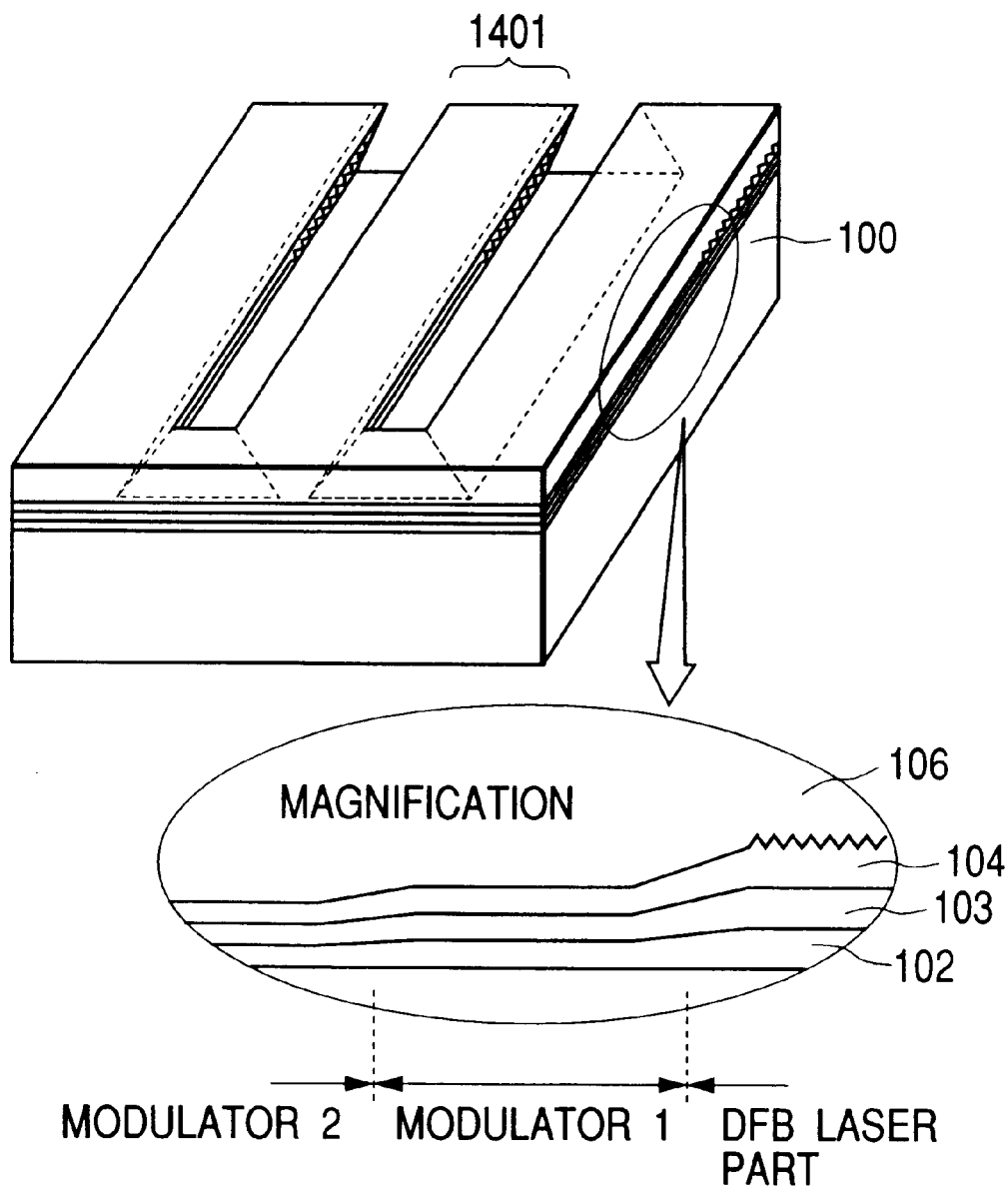
Figure 15:
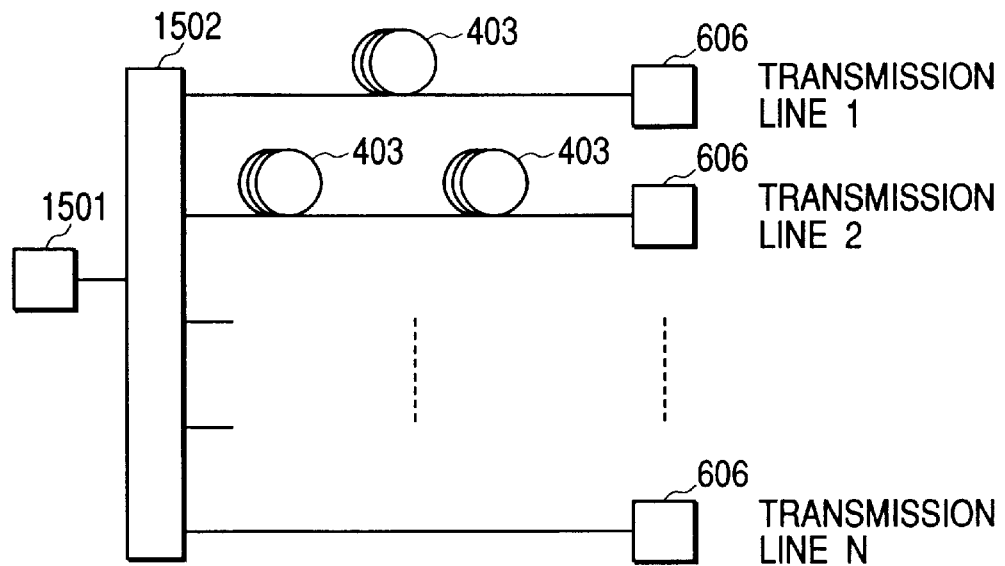
Figure 16:
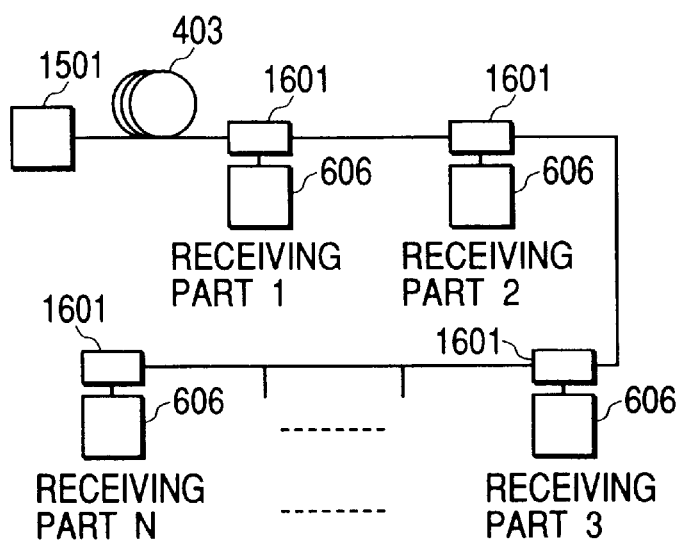

FIGS. 12($a$) and ($b$) show the structures of optical transmission systems according to the present invention;

FIG. 13 shows a view for explaining-of manufacturing the light emission element according to the present invention;

FIG. 14 also shows a view for explaining of manufacturing the light emission element according to the present invention;

FIG. 15 shows the structure of an optical transmission system according to the present invention; and FIG. 16 also shows the structure of an optical transmission system according to the present invention.

DETAILED DESCRIPTION OF PREFERRED EMBODIMENT(S)

Hereinafter, explanation will be given on from a first embodiment to a seventh embodiment.

A first embodiment of the present invention will be explained by referring to FIGS. 3 and 5–10. The present embodiment is one which is applied to a semiconductor EA modulator integrated DFB laser having a band of wavelength 1.5 $\mu$m, for use in optical transmission of 10 Gbit/s.

Figure 1:
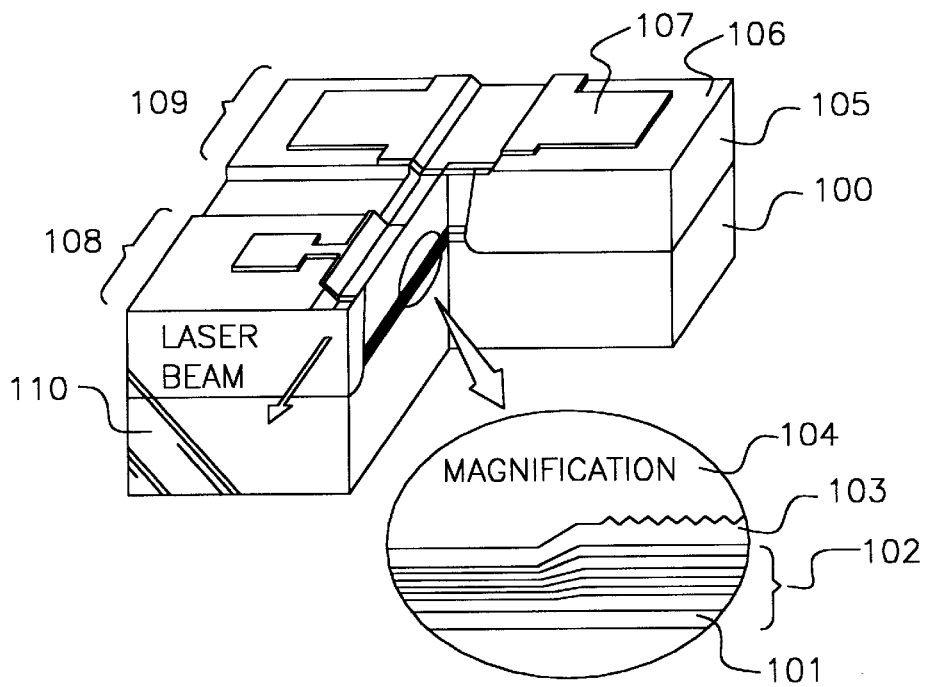
FIG. 1 shows a semiconductor EA modulator integrated DFB laser according to a related art.
Figure 2:
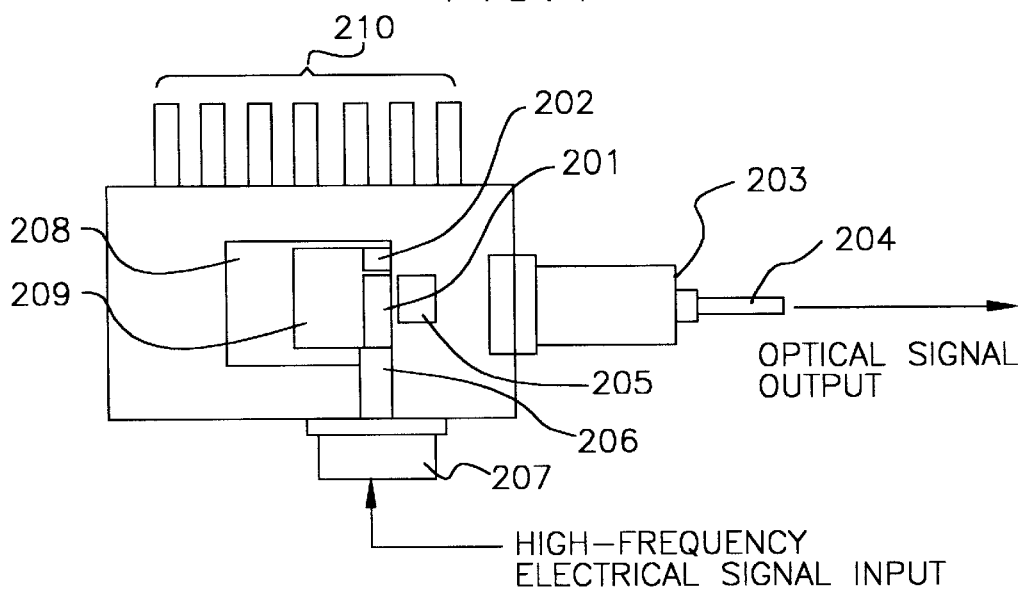
FIG. 2 shows another light emission element module according to the related art.
Figure 3:
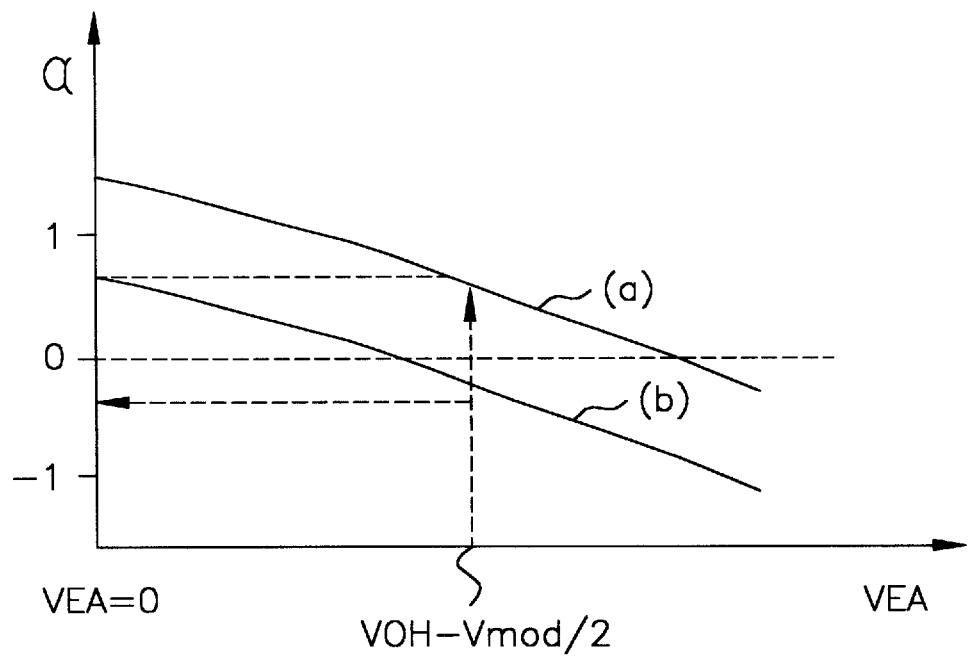
FIG. 3 shows an cc curve characteristic in the light emission element according to the related art.
Figure 4:
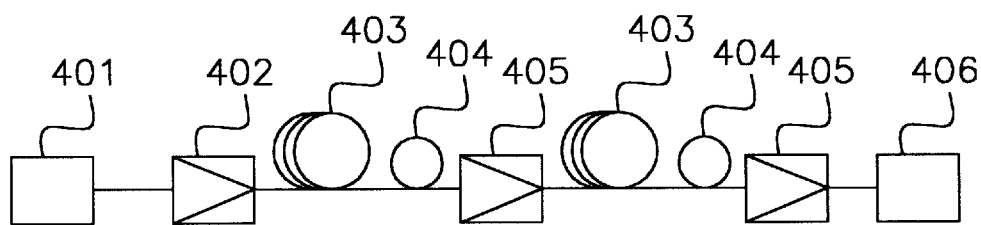
FIG. 4 shows the construction of an optical transmission system according to the related art.
Figure 5:
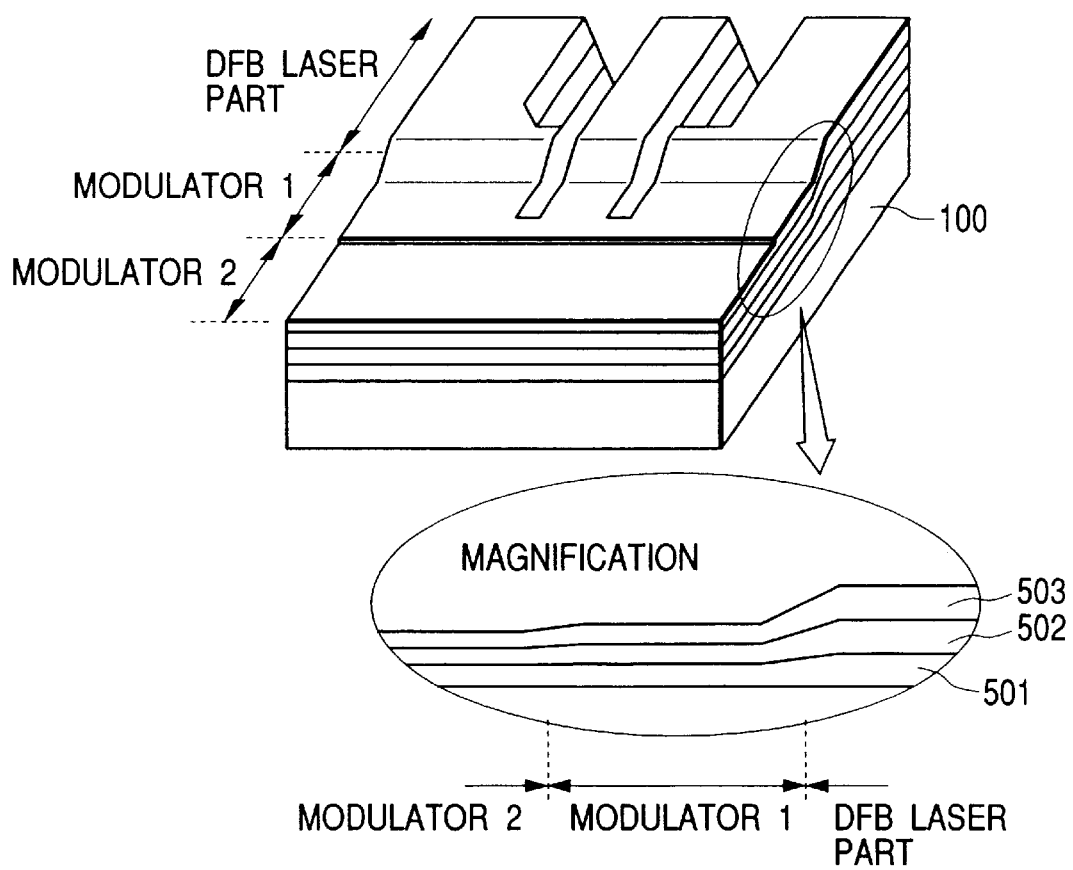
FIG. 5 shows a layer structure in a semiconductor EA modulator integrated DFB laser according to the present invention.

The FIG. 5 shows the layer structure of the semiconductor EA modulator integrated DFB laser, wherein a light emission portion thereof is applied to a laser portion.

In comparison with to the semiconductor EA modulator integrated DFB laser explained in the relevant arts, which is constructed with two portions, i.e., the laser portion and the EA modulator portion, an EA modulator integrated light source, as the light emission element according to the present invention is constructed with three portions, as shown in the FIG. 5, i.e. a laser portion, an EA modulator 1, and an EA modulator 3. Accordingly, after forming a mask of an oxidation film for the selective growth of patterns of the laser portion and the EA modulators 1 and 2, thereby to form total film thickness of the respective multiple-quantum-well structures in thick, in that order, and then are formed, as was mentioned in the relevant art 2, a lower optical separate-confinement-heterostructure 501 of n-type InGaAsP type, a strained multiple-quantum-well structure 502 being composed of seven (7) cycles or repetitions of a well layer of undoped InGaAsP and an undoped barrier layer of InGaAsP having a composite wavelength 1.3 μm, and an upper optical separate-confinement-heterostructure 503 of undoped InGaAsP at thickness of 60 nm, sequentially. In this instance, as shown in the FIG. 5, the total thickness of the multiple-quantum-well structure is formed in thick, in an order of the laser portion, the EA modulator 1, and the EA modulator 2. Accordingly, the absorption wavelength of the multiple quantum well structure in the EA modulators 1 or the EA modulator 2 is larger than the absorption wavelength of the laser portion, and further an absorption edge wavelength of the multiple-quantum-well structure in the EA modulator 2 is larger than that in the EA modulator 1, by about 5 nm.

The absorption edge wavelength of the modulator is defined by an exciton absorption peak wavelength of the modulator. In this case, the exciton means a pair of electron and hole existing within the quantum-well due to the Coulomb force and the quantum-confinement effect, and an energy of ground state of this exciton corresponds to an exciton absorption peak energy E. Accordingly, the exciton absorption peak wavelength λ can be given by λ=hc/E (where, h is the Plank constant, and c the velocity of light in vacuum).

Following to the above, in the same manner as in the relevant arts, forming of a diffraction grating, growing of a clad layer, forming of a mesa, and growing of an embedded Fe-InP layer are conducted.

Figure 6:
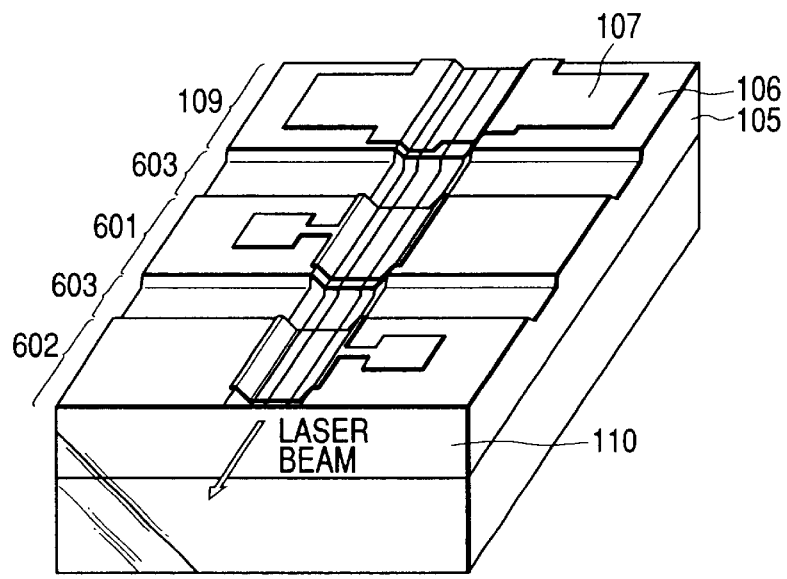
FIG. 6 shows the semiconductor EA modulator integrated DFB laser according to the present invention.

Next, by referring to the FIG. 6, the manufacturing processes or steps of the EA modulator integrated DFB laser will be explained in brief, herein after.

In this instance, differing from the relevant arts, for the purpose of integrating two of the modulators in front of the DFB laser, the length of mesa stripes in an optical axis is set to be long, such as 800 μm. Next, between the DFB laser (109) and the modulator 1 (601), and between the modulator 1 (601) and the modulator 2 (602), isolation grooves 603 are formed respectively. Also, for the purpose of ensuring isolation thereof, also ion injection of high resistance, such as proton or the like, may be conducted between the DFB laser (109) and the modulator 1 (601), and between the modulator 1 (601) and the modulator 2 (602), respectively, after forming a passivation film thereon. Continuously, another passivation film is formed, and p-side electrodes are formed. With the length of modulators, both the EA modulator 1 and the EA modulator 2 are set at 177 μm, and electrode pads are positioned on both sides of the EA modulator 1 and the EA modulator 2, putting a wave guide of mesa type therebetween. Hereinafter, it can be manufactured in the same manner as in the relevant arts.

Figure 7:
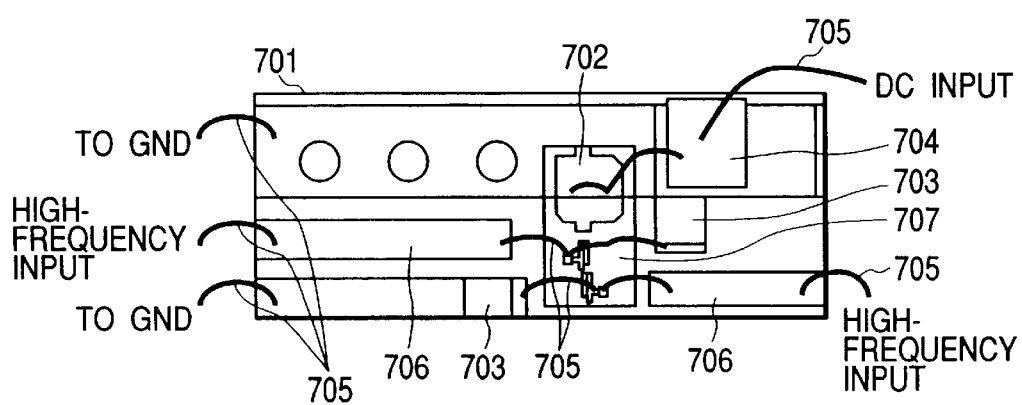
FIG. 7 shows a chip carrier in which is installed the semiconductor EA modulator integrated DFB laser, according to the present invention.

Next, FIG. 7 shows a view of the present light emission element, being mounted on a chip carrier.

In the chip carrier 701, two (2) high frequency lines 706 are positioned while putting a portion therebetween, where the EA modulators are mounted, so as not to form a directional coupler thereby. After mounting the EA modulator integrated DFB laser(s) 702 as the present element and a chip capacitor(s) 704 on the chip carrier 701, wire bonding is treated with an Au wire, on the laser portion, the EA modulator 1 and the EA modulator 2, respectively. In this instance, with each of the EA modulators and the Au wires, there can be considered an anxiety of cross-talk and/or leakage of high frequency wave, however since the pad portion of the EA modulators are positioned putting the mesa type wave guide therebetween, a sufficient distance can be kept between the Au wires for each, thereby to achieve a design without bringing about such the problem. Further, the high frequency line EA modulator(s) is terminated by a thin film resistor 703 at one end thereof, for suppressing electrical reflection therein.

Figure 8:
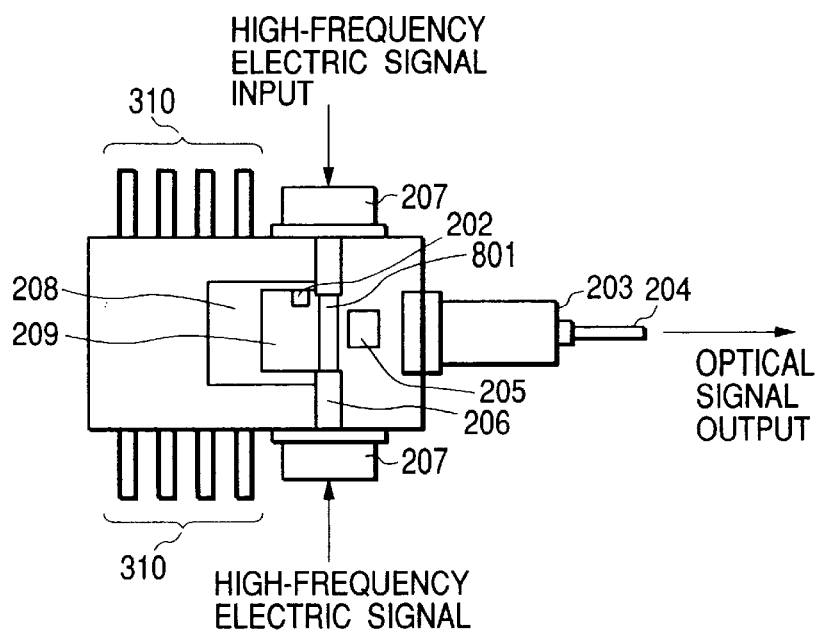
FIG. 8 shows a light emission element module according to the present invention.

Further, FIG. 8 shows the present element being mounted on or put in the light emission element module. When it is put into the module in this process, it is also sealed air-tightly, but being omitted to be shown in the figure. As is shown in the FIG. 8, a high frequency input is provided each on both sides of the chip carrier, therefore the light emission element module comes to be same to that of the explanation given on the first relevant art, except that it is of a dual (2) input type, wherein the high frequency input terminals are provided at both (right-hand and left-hand) sides (but, at upper side and lower side in the FIG. 8).

An optical output characteristic of the light emission element module, mounting the present EA modulator integrated DFB laser thereon, is reduced down by around 3 dB, comparing to that of the light emission element mounting the EA modulator integrated DFB laser explained in the relevant arts thereon, since two (2) EA modulators are integrated therein, however that fact will not bring about a problem in practical use thereof. Also, the band of high frequency characteristic and the reflection of electric signals come to be different, a little bit, when driving the EA modulator 1 or the EA modulator 2, but it is possible to control them within a level of causing no problem practically. Next, the characteristic of an extinction ratio and the a parameter show also different characteristics when driving the EA modulator 1 or the EA modulator 2. Explaining this by referring to the FIG. 3, the respective a parameters, in the case of driving the EA modulator 1 and the EA modulator 2, come to be such the characteristics corresponding to the curves (b) and (a) in the FIG. 3. Accordingly, it is possible to make it suitable with or fit to the transmission system of 40 km when driving the EA modulator 1, while being suitable with the transmission system of 20 km when driving the EA modulator 2. Because the two (2) high frequency inputs are provided in the present light emission element module, it takes a space a little bit more than when being positioned within an optical transmitter, however there can be obtain merits that the cross-talk with high frequency signal and the problem of the directional coupler hardly occur.

Figure 9:
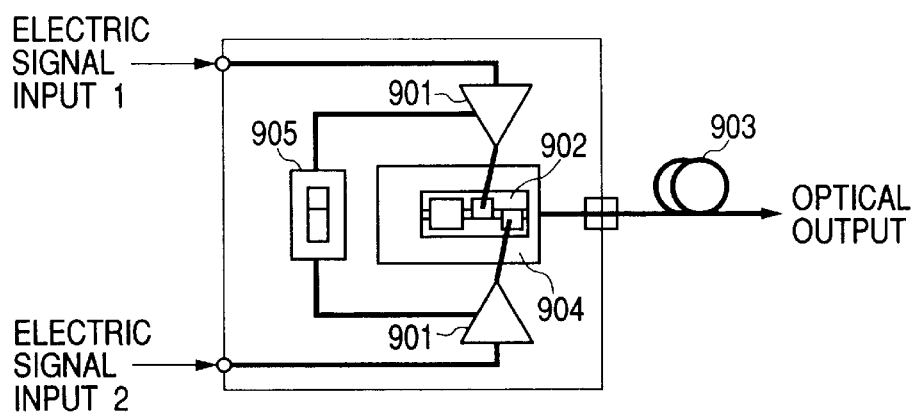
FIG. 9 shows an optical transmitter according to the present invention.
Figure 10:
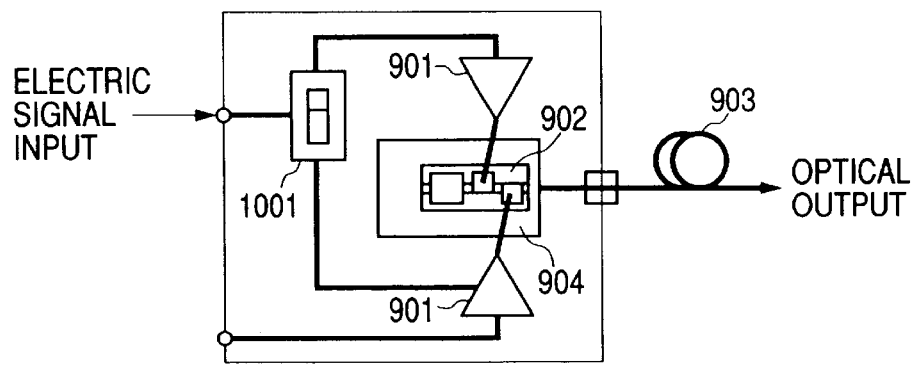
FIG. 10 shows another optical transmitter according to the present invention.

A block diagram of the light emission element module in the FIG. 8 is shown in FIGS. 9 and 10.

The optical transmitter in the FIG. 9 is constructed with a modulator driver 901, a light emission element 902 of the present invention, and a driver power source 905. The driver power source 905 has a change-over switch for power supply and also has a function of turning the bias into 0 V, to the modulator side not to be supplied with the power. In a case of this optical transmitter, the signal is inputted to the electric signal input 1 in the figure when the modulator 1 is used, while it is inputted to the electric signal input 2 in the figure when the modulator 2 is used, i.e., through change-over of the driver power source 905, it is possible to show different two (2) kinds of the a parameters, namely different two (2) kinds of transmission characteristics therewith.

On a while, the optical transmitter in the FIG. 9 is constructed with the modulator driver 901, the light emission element 902 of the present invention, a light emission element module 904 according to the present invention, and a high frequency change-over switch 1001. In this case, the input of the electric signal is only one (1), therefore it is possible to change over the high frequency change-over switch 1001 between the modulator 1 and the modulator 2, thereby to show or provide different two (2) kinds of the a parameters, namely different two (2) kinds of transmission characteristics therewith.

In the explanation on manufacturing of the light emission element of the present embodiment, active layers of the EA modulator 1 and the EA modulator 2 are formed, simultaneously, with using the selective area growth method in a first process of crystal growing. Therefore, it is easy in the manufacturing process thereof.

Though the modulator length is set at 177 μm, for example, however it is possible to obtain the similar effect when changing the condition, accompanying with the change in a specification about the band region of the present light emission element and the extinction ratio when voltage is applied to the modulator, etc.

Further, though taking the method mentioned above in installation of the light emission element module, it is also possible to determine the specification to be same to or fit with the a curve of either the modulator 1 or the modulator 2, from the estimation result of the present element, on a stage of the condition of the light emission element module, thereby to achieve an instillation being similar to that of the light emission element according to the relevant arts, wherein only one of the EA modulator is provided. However, in this case, it is impossible to select the a parameter after the installation of the light emission element module any more.

Next, another example will be explained as a second embodiment, hereinafter.

Figure 11:
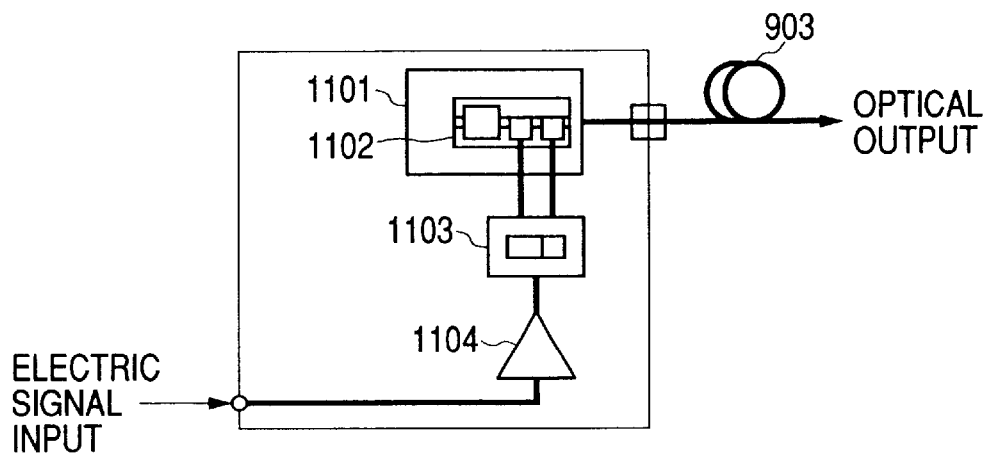
FIG. 11 shows an other optical transmitter according to the present invention.

FIG. 11 shows a view of an optical transmitter installing the light emission element according to the first embodiment therein, in which the electrode pads of the two (2) EA modulators are formed in the same direction upon basis of the mesa type wave guide in the modulator 1 and the modulator 2, and after being assembled into the light emission element module. With the light emission element and the manufacture of the light emission element module, though different in the forming of electrodes of the light, emission element and the position of the high frequency input portion when assembling the light emission module, since they are almost similar to those mentioned above, the explanation thereof is omitted here.

The optical transmitter shown in the FIG. 11 is constructed with a modulator driver 1101, a light emission element 1102 on which the electrode pads are formed in the same direction of the mesa type wave guide of the light emission element, a light emission element module 1101, a high frequency change-over switch 1103, and a modulator driver 1104. In this case, the input of the signal is only one (1), and the modulator 1 or the modulator 2 is changed therebetween by change-over of the high frequency change-over switch 1103, therefore it is possible to have different two (2) kinds of the a parameters, namely different two (2) kinds of transmission characteristics.

As a further other example will be explained as a third embodiment, hereinafter.

With the structure of a transmission path or route 1 shown in the FIG. 12(*a*), after the optical transmitter 1201 according to the present invention, it is constructed with the optical pre-amplifier 402, the optical fibers 1202 (dispersal value: 800 ps/nm) of 40 km, the optical post-amplifier 405, and the optical receiver 406.

With the structure of a transmission path or route 2 shown in the FIG. 12(*b*), after the optical transmitter 1201 according to the present invention, it is constructed with the optical pre-amplifier 402, the optical fibers 403 (dispersal value: 400 ps/nm) of 20 km, the dispersion compensated fibers 404 provided at every distance of about 20 km, the optical post-amplifier 405, and the optical receiver 406.

Accordingly, with applying the present invention therein, it is possible to select either one of the two (2) kinds of the modulators, depending upon the system which is different in the transmission distance thereof. For example, in the case of the transmission path shown in the FIG. 12(*a*), namely, in the optical transmission system of the ordinary optical fibers being longer than 20 km and up to 40 km (dispersal value: 800 ps/nm), for example, wherein no dispersion compensation is conducted, the modulator 1 is used while the EA modulator 2 can be used for the optical transmission system, in which the frequency dispersion of light in the fiber is compensated at every distance of 20 km, as in the transmission path shown in the FIG. 12(*b*). Namely, it is possible to cope with two (2) kinds of systems with only one of the transmitter.

Further, a fourth embodiment as the other example thereof, will be explained by referring to the FIGS. 6 and 13.

In the same manner as in the relevant arts, with the known selective area growth method are formed a lower optical separate confinement heterostructure 101 of n-type InGaAsP type, the strained multiple-quantum-well structure 103, being composed of eight (8) cycles or repetition of a well layer of undoped InGaAsP and an undoped barrier layer of InGaAsP having a composite wavelength 1.15 μm, and an upper optical separate-confinement-heterostructure 104 being composed of two (2) layers of an undoped InGaAsP layer and a P-type InGaAsP layer, and a p-type InP cap layer 105, sequentially. Following to this, a portion of a region(s) where the film(s) is/are formed in thin thickness with the selective growth method is treated by an etching, such as a dry etching with using SiN film as a mask. Further, after treatment by a wet etching, in the region where the above-mentioned dry etching is treated, as shown in the FIG. 13, there are re-grown a lower optical separate confinement heterostructure 1301 of n-type InGaAsP, a strained multiple-quantum-well structure 1302 being composed of seven (7) cycles or repetition of a well layer of undoped InGaAsP and an undoped barrier layer of InGaAsP having a composite wavelength 1.3 μm, an upper optical separate-confinement-heterostructure 1303 of undoped InGaAsP, and a p-type InP cap layer 105, sequentially, with a butt-joint method. Following to this, after removal of the SiN layer, the light emission element is manufactured, so that two (2) sets of the modulators are formed therewith, in the same manner as in the first embodiment. However, the EA modulator integrated DFB laser manufactured in this manner comes to be almost similar to that shown in the FIG. 6, in an outer appearance thereof, therefore the detailed view of the completed one is omitted to be shown here.

Between the portion of the modulator 1 and the portion of the modulator 2, there are differences in the structures of the lower optical separate-confinement-heterostructure, the multiple-quantum-well structure, and the upper optical separate-confinement-heterostructure thereof, therefore, in the same manner as in the first embodiment, the a parameter differs when the EA modulator 1 or the EA modulator 2 is driven by each. Further, in addition thereto, the following fact is also a factor of the difference of the α parameter. Namely, in the portion of the modulator 1 and the upper optical separate-confinement-heterostructure of the modulator 2, while the upper optical separate-confinement-heterostructure 104 is formed with the two (2) layers of the undoped InGaAsP layer and the p-type InGaAsP layer in the modulator 1, the upper optical separate-confinement-heterostructure 1303 is formed with the undoped InGaAsP layer in the modulator 2. Therefore, there are differences in profiles of the doping dentistry in the p-type InP layer, due to the difference in the doping level in the upper optical separate-confinement-heterostructures and due to an influence of diffusion of the dopant after the growth of the p-type InP clad layer, between the modulator 1 and the modulator 2. Also, due to the difference in the p-type doping density of this p-type doping layer, the α parameter characteristics come to have the different values, respectively.

Accordingly, with the installation or assembling of the present light emission element into the light emission element module so as to be a light source for transmission, either one can be selected from the two (2) kinds of the a curve depending upon the system, thereby obtaining the effects being same to those in the first embodiment. Further, according to the present embodiment, the butt-joint technology is utilized in manufacturing the EA modulator 2, therefore can obtain an advantage that freedom comes to be large in the designing on the multiple-quantum-well structure of the EA modulator 2, comparing to the first embodiment.

The modulator length of the present embodiment is set at 177 μm, however it is also possible to obtain the same effect(s) by changing the conditions, accompanying the specifications in the band region of the light emission element and the extinction ratio when applying voltage to the modulator, etc.

Also, in the present embodiment, the composite wavelength of the barrier layer in the multiple-quantum-well structure, the number of the quantum-well, and the thickness of the upper optical separate-confinement-heterostructure are different in the modulator 1 and the modulator 2, respectively. This is because, since the α parameter is defined by (change amount in refractive index)/(change amount in absorption coefficient), it depends upon the material and the MQW structure. Accordingly, when designing the a parameter, it is also possible to obtain the same effect(s), when designing it by adjusting the parameters, such as, the composite wavelength of the barrier layer in the multiple-quantum-well structure, the number of the quantum-well, the thickness of the upper optical separate-confinement-heterostructure layer of InGaAsP, and the doping density of the upper optical separate-confinement-heterostructure of InGaAsP, etc. Further, in the present embodiment, the explanation was given on the present embodiment, assuming that the portion of the modulator 2 is re-grown with the butt-joint method, however it is also possible to obtain the same effect(s) by combining with the portion of the modulator 1 and the portion of the DFB laser, or either one of them. The feature of the present embodiment lies, different from the first embodiment, in that those parameters can be adjusted or designed freely when growing crystal of the portion of the modulator 2 in the manufacturing process of the light emission element. In this instance, if an absorption edge of an active layer in the EA modulator 1 is equal to or larger than that in amount, comparing to the absorption edge of an active layer in the EA modulator 2, it is needless to say that the same effect(s) can be obtained, being same to that mentioned in the present embodiment.

Also, with the light emission element module for use in the optical transmission, the optical transmitter, and the optical transmission system, into which the light emission element of the present embodiment is applied, there can be considered the same ones as shown in the embodiments 2 and 3, therefore obtaining the same effect(s) therewith.

Further, a fifth embodiment as the further other example of the present embodiment, will be explained by referring to FIG. 14.

The present embodiment is for use in the optical transmission of 10 Gbit/s, and is an embodiment which is applied to a ridge wave-guide type EA modulator integrated DFB laser of a wavelength band 1.5 μm.

After forming the selective area growth of the first time, in accordance with the method being same to that of the first embodiment, the layers are formed in the order of the laser portion of the multiple-quantum-well structure, the EA modulator 1, and the EA modulator 2 in thick. Further, according to the processes of the first embodiment, after forming the diffraction grating, the clad layer is formed. Following to this, with using the wet etching by means of a water solution mixing hydrogen bromide and phosphoric acid therein, a mesa-type optical wave guide 1401 is formed as shown in the FIG. 14, which has a (111)A surface on a side wall and a reversed mesa cross-section shape. Thereafter, the light emission element is manufactured by the ordinary processes of the ridge wave guide type laser.

The EA modulator integrated DFB laser of the present embodiment also has, in the same manner to the first embodiment, the modulator 1 and the modulator 2, therefore it can be said that the same effect(s) can be obtaining therewith. Further, the structure of the ridge wave-guide type, which is explained in the present embodiment, includes no such the buried growth of the Fe-InP therein, in comparison with the first embodiment and the second embodiment, therefore achieving an effect that the light emission element can be manufactured easily.

In the present embodiment, the selective growth technology is utilized for changing the total thickness of the multiple-quantum-well structures in the laser portion, and the EA modulator 1 and the EA modulator 2. However, as was explained in relation with the fourth embodiment, it is needless to say that the manufacture of the light emission element achieving the same is also possible in a cases where the light emission element is manufactured with changing the total thickness of the multiple-quantum-well structures in the laser portion, and the EA modulator 1 and the EA modulator 2, by combining the selective growth method and the butt-joint method.

Also, with the light emission element module for use in the optical transmission, the optical transmitter, and the optical transmission system, into which the light emission element of the present embodiment is applied, there can be considered the same structure as shown in the embodiments 2 and 3, therefore obtaining the same effect(s).

Further, a sixth embodiment as the further other example of the present embodiment, will be explained by referring to FIG. 15.

The present embodiment is the EA modulator integrated DFB laser for use in the optical transmission of 10 Gbit/s, and is also an embodiment of an optical transmission system, into which is applied the light emission element being integrated with n pieces (n≧2) of EA modulators in series. In the first embodiment, the fourth embodiment and the fifth embodiment, there are described the method for manufacturing the elements, in which two (2) pieces of the EA modulators are integrated with, however also the integration of n pieces of the EA modulators is possible in the same manner, by the selective growth method and the butt joint method. Also, for determining the value n, considerations must be paid to an optical output power of the laser and the cross-talk of high frequency signal when installing or assembling the light emission element module.

An example of the optical transmission system is shown in FIG. 15, in particular, in a case where the optical transmitter is manufactured with using the light emission element, in which the n piece of the EA modulators are integrated in series.

The FIG. 15 shows the optical transmission system, being constructed with the light emitter 1501 installing the light emission element, in which the n piece of the EA modulators are integrated in series, an 1:n optical switch 1502, the optical fiber(s) 403 and an optical receiver 606. In this case, since the distances from the optical transmitter to the optical receiver are different, respectively, therefore due to the restriction from the chirping, there occurs a necessity that the optical signal must be transmitted by a transmitter source having the α parameter being different depending upon the distances. With using the optical transmitter, according to the present invention, in which is installed the light emission element integrating the n piece of the EA modulators therein, being different in the a parameters thereof, it is possible to transmit data to desired positions being different in the distances, by changing over the EA modulators to be used, depending upon the distance from the optical transmitter to the optical receiver in connection with the optical switch 1502 of 1:n. As a manner of change-over of the EA modulators, there can be considered one wherein, for example, the receiving portions from 1 to n1 are assigned for driving the EA modulator 1, while the other portion from n2 to n3 are for driving the EA modulator 2, etc.

In the conventional manner, the data is converted into the optical signal to be transferred after distributing it into n pieces of the transmission paths by means of electric signals, therefore there are necessitated n pieces of the optical transmitters for converting the electric signals into the optical signals corresponding to the respective optical distances. However, with using the present invention, it is possible to construct the system wherein the signal from one of the optical transmitter is distributed by the optical switch so to perform communications at the different transmission distances. In the case of this system, it is enough with only one of the optical transmitter to manage, thereby bringing about large merits on the cost reduction and/or on the designing thereof, since the system construction can be simplified therewith.

Further, a seventh embodiment, as the further other example of the present embodiment, will be explained by referring to FIG. 16.

The present embodiment is an embodiment wherein the light emission element is applied into an optical path network, in which the n pieces (n≧2) of the EA modulators are integrated in series in the EA modulator integrated DFB laser, for use in the optical transmission of 10 Gbit/s.

The FIG. 16 shows an optical transmission system, being constructed with the light emitter 1501 installing the light emission element, in which the n piece of the EA modulators are integrated in series, a 1:1 optical switch 1601, the optical fiber(s) 403, and an optical receiver 606. In this case, since the distances from the optical transmitter to the optical receiver are different, respectively, therefore due to the restriction from the chirping, there also occurs the necessity that the optical signal must be transmitted by a transmitter source having the a parameters being different depending upon the distances. With using the optical transmitter according to the present invention, i.e., installing the light emission element, in which the n piece of the EA modulators are integrated, being different in the a parameters thereof, it is possible to transmit data to the desired positions being different in the distances, by changing over the EA modulators to be used, depending upon the distance from the optical transmitter to the optical receiver, in connection with the optical switch 16502. As a manner of changing over the EA modulators is, there can be considered one wherein, for example, the receiving portions from 1 to n1 are assigned for driving the EA modulator 1, while the other portion from n2 to n3 are for driving the EA modulator 2, thereby being applicable or usable in the optical path networks having wide transmission distances therewith.

According to the present invention, the EA modulator integrated light source having two transmission properties or characteristics being different to each other can be achieved by only one piece of the light emission element, and further it is also possible to cope with the two (2) different optical transmission systems by means of the only one light emission element module or optical transmitter, into which the light emission element of the present invention is applied or installed. Further, since it is possible to cope with the systems more than two (2) by means of the properties or characteristics of the only one light emission element, therefore it brings bout an important merit on the cost reduction in manufacturing of the light emission elements. Also with regard the light emission element module and the optical transmitter, there is no need to divide them for each of the systems, thereby achieving low cost and easiness in adjustment of the system, and also in designing of the optical transmission circuit.

What is claimed is:

1. A semiconductor electro-absorption modulator integrated light emission element, comprising:

a light emitting portion having a semiconductor multiple-quantum-well structure, including a well layer and a barrier layer in an active layer of light emission region thereof, for lasing a single in vertical mode;

a modulator proton being positioned at a light emission side of said light emitting portion, and being constructed with a plurality of electro-absorption optical modulators, each having the semiconductor multiple-quantum-well structure including the well layer and the barrier layer therein, and optical separate-confinement-heterostructures putting said semiconductor multiple-quantum-well structure including the well layer and the barrier layer therebetween, wherein an absorption edge wavelength under no biasing condition on the semiconductor multiple-quantum-well structure, owned by said modulator which is near to the light emission side of said light emitting portion, is equal to or longer than the absorption edge wavelength which is owned by said modulator positioned far from the light emission side of said light emitting portion.

2. A semiconductor electro-absorption modulator integrated light emission element, as defined in the claim 1, wherein said plurality of modulators have respective α parameter values according to a fiber-response-peak method, being different to each other.

3. A semiconductor electro-absorption modulator integrated light emission element, as defined in the claim 2, wherein two of said modulators neighboring each other are different to each other, in the thickness of said optical separate-confinement-heterostructures thereof.

4. A semiconductor electro-absorption modulator integrated light emission element, as defined in the claim 2, wherein two of said modulators neighboring each other are different to each other, in composition ratio of said barrier layer in the semiconductor multiple-quantum-well structure.

5. A semiconductor electro-absorption modulator integrated light emission element, as defined in the claim 2, wherein two of said modulators neighboring each other are different to each other, in a number of layers of said well layer in the semiconductor multiple-quantum-well structure.

6. A semiconductor electro-absorption modulator integrated light emission element, as defined in the claim 2, wherein two of said modulators neighboring each other are different to each other, in a density of p-type doping in a p-type doping layer thereof.

7. A semiconductor electro-absorption modulator integrated light emission element, as defined in the claim 2, wherein two of said modulators neighboring each other are different to each other, in EA modulator length thereof.

8. A light emission element module, comprising:
   a carrier chip, on which is mounted the semiconductor electro-absorption modulator integrated light emission element being described in the claim 2;
   a plurality of signal wirings for electrically connecting between said light emission element and said chip carrier, for transmitting electric signals corresponding to the number of said modulators in said modulator portion;
   a plurality of input terminals corresponding to the number of said modulators, being connected to said signal wirings for transmission of said electrical signals;
   a lens for condensing a signal light;
   an isolator for polarizing said signal light; and
   an optical fiber for transmitting said signal light, wherein said lens, isolator and optical fiber are fixed on an optical axis of a signal light, which is obtained through electric/photo conversion of said electric signal by said light emission element, and are air-tightly sealed as a package.

9. An optical transmitter, comprising:
   a drive circuit portion, being constructed with a driver circuit for inputting an electric signal to be transmitted as a signal light, and a change-over switch for changing over a route of said electric signal with a change-over signal; and
   an optical transmitter, being constructed with the light emission element module as described in the claim 8, wherein
   any one of said plurality of modulators is driven by said change-over signal.

10. An optical transmission system, comprising:
    an optical transmitter as described in the claim 9;
    an optical switch for inputting a signal light emitted from said optical transmitter and for changing over to any one of plural output routes existing, depending upon a change-over signal;
    a plurality of optical fibers for inputting an output of said optical switch, corresponding to said plural output routes; and
    an optical receiver for receiving said signal light transmitted on said optical fiber, wherein the transmission route is changed over depending upon said change-over signal.

11. A light wavelength multiplex optical transmission system, comprising:
    a plurality of optical transmitters as described in the claim 9, for emitting lights, each being different in wavelength;
    an optical coupler for multiplexing the signal lights of said plurality of optical transmitters and for outputting a wavelength multiplex signal light;
    an optical switch for inputting the wavelength multiplex signal light and for changing over to any one of plural output routes existing, depending upon a change-over signal;
    a plurality of optical fibers for inputting an output of said optical switch, corresponding to said plural output routes;
    an optical divider for dividing said wavelength multiplex signal light into the respective signal lights at each wavelength thereof; and
    an optical receiver for receiving said signal light transmitted on said optical fiber, wherein the transmission route is changed over depending upon said change-over signal.

12. A semiconductor electro-absorption modulator integrated light emission element, as defined in the claim 2, wherein said semiconductor multiple-quantum-well structure is strained multiple-quantum-well structure, and two of said modulators neighboring each other are different to each other, in the thickness of said well layer and thickness of the barrier layer.

13. A light emission element module, comprising:
    a carrier chip, on which is mounted the semiconductor electro-absorption modulator integrated light emission element being described in the claim 12;
    a plurality of signal wirings for electrically connecting between said light emission element and said chip carrier, for transmitting electric signals corresponding to the number of said modulators in said modulator portion;
    a plurality of input terminals corresponding to the number of said modulators, being connected to said signal wirings for transmission of said electrical signals;
    a lens for condensing a signal light;
    an isolator for polarizing said signal light; and
    an optical fiber for transmitting said signal light, wherein said lens, isolator and optical fiber are fixed on an optical axis of a signal light, which is obtained through electric/photo conversion of said electric signal by said light emission element, and are air-tightly sealed as a package.

14. An optical transmitter, comprising:
    a drive circuit portion, being constructed with a driver circuit for inputting an electric signal to be transmitted as a signal light, and a change-over switch for changing over a route of said electric signal with a change-over signal; and
    an optical transmitter, being constructed with the light emission element module as described in the claim 13, wherein any one of said plurality of modulators is driven by said change-over signal.

15. An optical transmission system, comprising:
    an optical transmitter as described in the claim 14;
    an optical switch for inputting a signal light emitted from said optical transmitter and for changing over to any one of plural output routes existing, depending upon a change-over signal;

a plurality of optical fibers for inputting an output of said optical switch, corresponding to said plural output routes; and an optical receiver for receiving said signal light transmitted on said optical fiber, wherein the transmission route is changed over depending upon said change-over signal.

16. A light wavelength multiplex optical transmission system, comprising:

a plurality of optical transmitters as described in the claim 14 for emitting lights, each being different in wavelength;

an optical coupler for multiplexing the signal lights of said plurality of optical transmitters and for outputting a wavelength multiplex signal light;

an optical switch for inputting the wavelength multiplex signal light and for changing over to any one of plural output routes existing, depending upon a change-over signal;

a plurality of optical fibers for inputting an output of said optical switch, corresponding to said plural output routes;

an optical divider for dividing said wavelength multiplex signal light into the respective signal lights at each wavelength thereof; and an optical receiver for receiving said signal light transmitted on said optical fiber, wherein the transmission route is changed over depending upon said change-over signal.

* * * * *